United States Patent [19]
Hsieh

[11] Patent Number: 5,684,667
[45] Date of Patent: Nov. 4, 1997

[54] FULL FAILURE PROTECTOR MODULE

[76] Inventor: King-long Hsieh, 14th Fl., No. 12, Lane 118, Sec. 1, Chungyang Rd., Tucheng City, Taipei Hsien, Taiwan

[21] Appl. No.: 703,481

[22] Filed: Aug. 27, 1996

[51] Int. Cl.⁶ .................................................... H01L 7/12
[52] U.S. Cl. ........................................ 361/119; 361/124
[58] Field of Search ................................ 361/117, 118, 361/119, 56, 111, 91, 103, 106, 124, 129; 340/659, 660, 662

[56]         References Cited

U.S. PATENT DOCUMENTS

| | | | |
|---|---|---|---|
| 4,729,055 | 3/1988 | Dorival et al. | 361/119 |
| 4,876,626 | 10/1989 | Kaczmarek | 361/119 |
| 5,359,657 | 10/1994 | Pelegris | 379/412 |
| 5,450,269 | 9/1995 | Hsieh | 361/119 |
| 5,523,916 | 6/1996 | Kaczmarek | 361/119 |

*Primary Examiner*—Brian K. Young
*Assistant Examiner*—Michael J. Sherry
*Attorney, Agent, or Firm*—Thomas, Kayden, Horstemeyer & Risley

[57]            ABSTRACT

A protector module includes two input prongs receiving electrical signals from an outside plant, two output prongs outputting electrical signals to exchange equipment, a ground prong for grounding an abnormal signal induced by lightning strikes, an indicating device, a printed circuit board defining a plurality of pad portions and through holes, and two blocks each receiving a plurality of arresters, thermistors, and tin bits and respectively mounted on a first surface and a second surface of the printed circuit board.

4 Claims, 3 Drawing Sheets

FULL FAILURE PROTECTOR MODULE

BACKGROUND OF THE INVENTION

1. Field of the Invention

The present invention relates to a protector for use in telecommunications and, more particularly, to an improved grounding protection indication for a protector.

2. Description of the Prior Art

Protectors in telecommunications are equipped between outside plates and exchange equipment for protecting the switching networks thereof from high-voltage and high-current damage resulting from lightning strikes etc. A protector module is shown in U.S. Pat. No. 4,876,626 to Kaczmarek dated Oct. 24, 1989. When one inlet prong of the protector module is struck by lightning, only one inlet prong is ground. U.S. Pat. No. 5,450,269, entitled *Grounding Arrangement for a Protector in Telecommunications*, assigned to the same assignee as is the present application, utilizes an arrester holder mechanism for simultaneously grounding two inlet prongs when any one of the inlet prongs is struck by lightning. However, such conventional protectors have a great amount of components which require to be assembled, this will take a great time and increase the occurrence of failures.

A protector module is shown in commonly assigned co-pending U.S. patent application Ser. No. 08/531,963, filed Sep. 21, 1995.

It is an object of the present invention to provide a protector module with improved responsiveness and reliability.

SUMMARY OF THE INVENTION

A protector module includes a housing having an end wall and an opening opposite to said end wall, an insulating member forming a base, said member closing said opening, two input prongs projecting from the base for receiving electrical signals from an outside plant, two output prongs projecting from the base for outputting electrical signals to exchange equipment, a ground prong projecting from the base for grounding an abnormal signal induced by lightning strikes, an indicating device having a first end connected to a negative voltage source for indicating the failure of the protector module and a second end, a printed circuit board having a first surface defining a ground pad portion electrically connected to the ground prong, a first through hole and a second through hole near the ground pad portion and electrically connected to the input prongs, respectively, a third through hole and a fourth through hole near the first and the second through holes and electrically connected to the second end of the indicating device and a second surface defining a fifth through hole and a sixth through hole electrically connected to the ground pad portion and each having a line extending toward the first and the second through holes, respectively, a first block and a second block respectively mounted on the first surface and the second surface of the printed circuit board and each of the blocks defining two recesses, a spring having an extension arm, an arrester, a tin bit having a pin respectively received within each of the recesses of the first block with the extension arm electrically connected to the ground pad portion, the pin extending to the first and the second through holes, and the arresters facing the ground pad portion and the third and the fourth through holes, and a biasing means having an extension leg, a thermistor, a fusible means having a protrusion respectively received with each of the recesses of the second block with the extension legs electrically connected to the output prongs, the protrusion extending into the first and the second through holes, and the thermistors facing the lines extending toward the first and the second through holes and the third and the fourth through holes.

Other objects, advantages, and novel features of the invention will become more apparent from the following detailed description when taken in conjunction with the accompanying drawings.

In the figures, like reference numerals are used to refer to like elements throughout.

DETAILED DESCRIPTION OF THE PREFERRED EMBODIMENTS

Referring now to the several drawing figures in which identical elements are numbered identically throughout, a description of the preferred embodiment of the present invention will now be provided.

Figure 1:
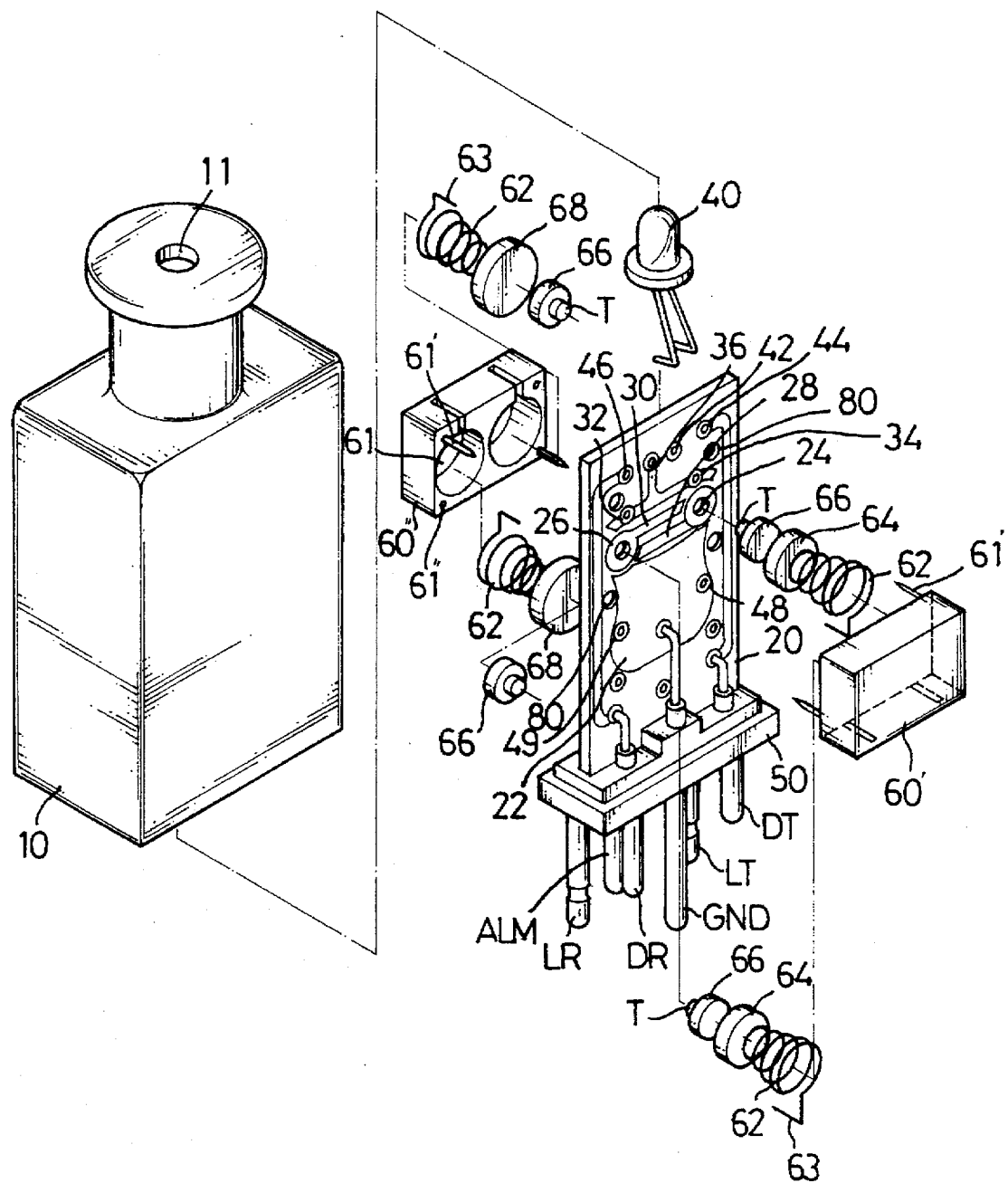
FIG. 1 is an exploded perspective view of a protector module of the present invention wherein a first surface of a printed circuit board is shown.

FIG. 1 is a perspective exploded view of a protector module connected between an outside plant and an exchange apparatus (not shown). The protector module of the present invention includes a housing 10 defining a hole 11, a printed circuit board (PCB) 20 received within the housing 10, two inlet prongs LR, LT, two outlet prongs DR, DT, a warning prong ALM, and a ground prong GND coupled to the printed circuit board 20 via a base 50. A grounded copper pad portion 22 is defined on the first surface of the PCB 20 and two through holes 24, 26 each having a line 28, 30 extending to each other are respectively defined near the grounded copper pad portion 22. The grounded copper pad portions 22 are coupled to a ground via the prong GND. Two electrically-connected through holes 32, 34 are defined near the through holes 24, 26 and a through hole 36 is electrically connected to the through hole 26 for connecting to an LED 40 to be inserted within the hole 11. A through hole 42 is defined near the through hole 36 for the LED 40 to connect thereto. Two through holes 44, 46 each having an extending line are defined near the through holes 36, 42 and electrically connected to the prongs DR, DT, respectively. Two through holes 48, 49 are defined in the grounded pad portion 22.

Figure 2:
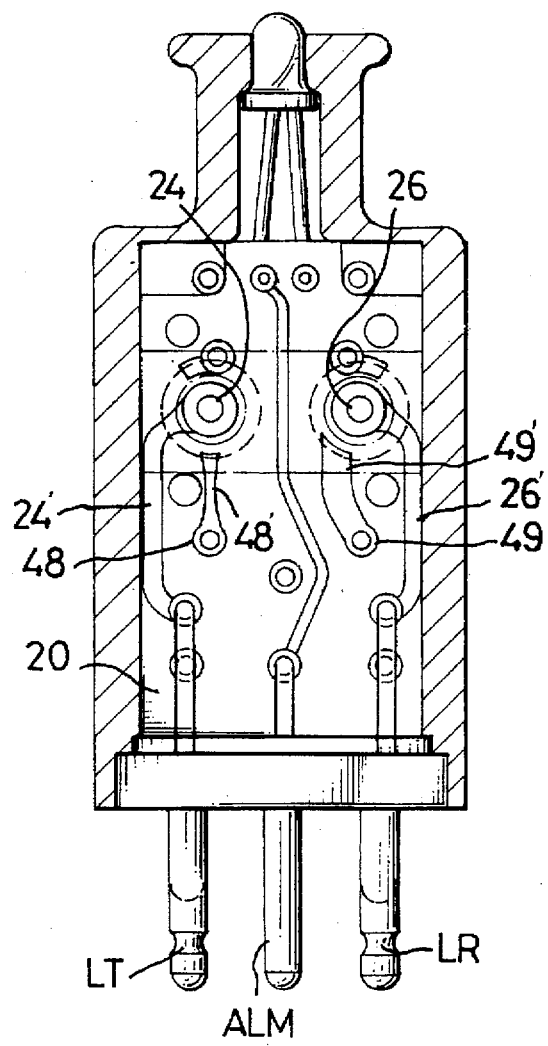
FIG. 2 is a schematic view of a second surface of the printed circuit board of the protector module of the present invention.

Referring to FIG. 2, a second surface of the PCB 20 is shown. The through holes 24, 26 each extends a line 24', 26' for electrically connecting to the prongs LT, LR. The through hole 42 extends a line for connecting to the prong ALM. The through holes 48, 49 each extending a line 48', 49' toward the through holes 24, 26.

Referring back to FIG. 1, two blocks 60', 60" each defines two circular recesses 61 facing each other are respectively provided on the first surface and the second surface of the PCB 20. Each of the recesses 61 of the block 60' facing the first surface of the PCB 20 receives a spring 62 having an extension arm 63, an arrester 64, and a tin bit 66 having a pin T extending into the through holes 24, 26. Each of the recesses 61 of the block 60" facing the second surface of the PCB 20 receives a spring 62 having an extension arm 63, a thermistor 68, and a tin bit 66 having a pin T extending into the through holes 24, 26. Each of the recesses 61 has a gap for a corresponding extension arm 63 to extend therethrough and connected to a corresponding through hole. The blocks 60', 60" each defines two bosses 61' and two apertures 61". The PCB 20 further defines four holes 80 for the bosses 61' to extend through and engage with the apertures 61" thereby mounting the blocks 60' and 60" together.

Figure 3:
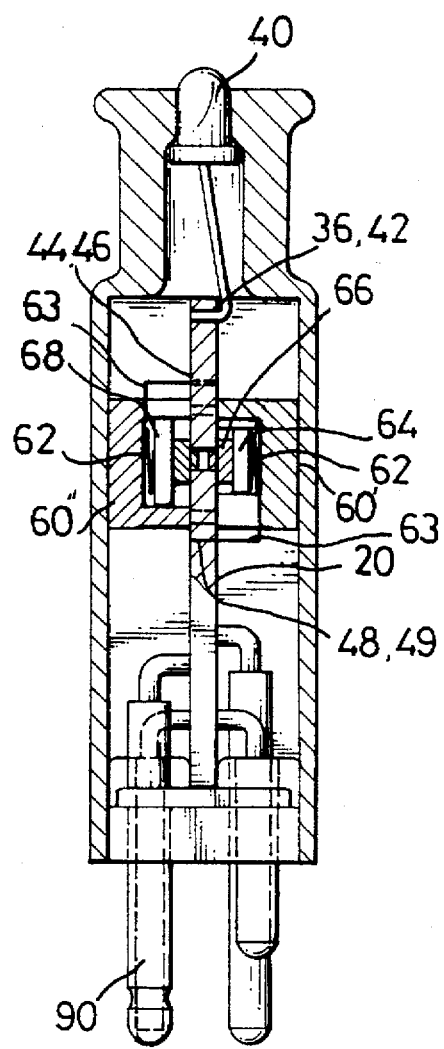
FIG. 3 is a cross sectional view of the protector module of FIG. 1.
Figure 4:
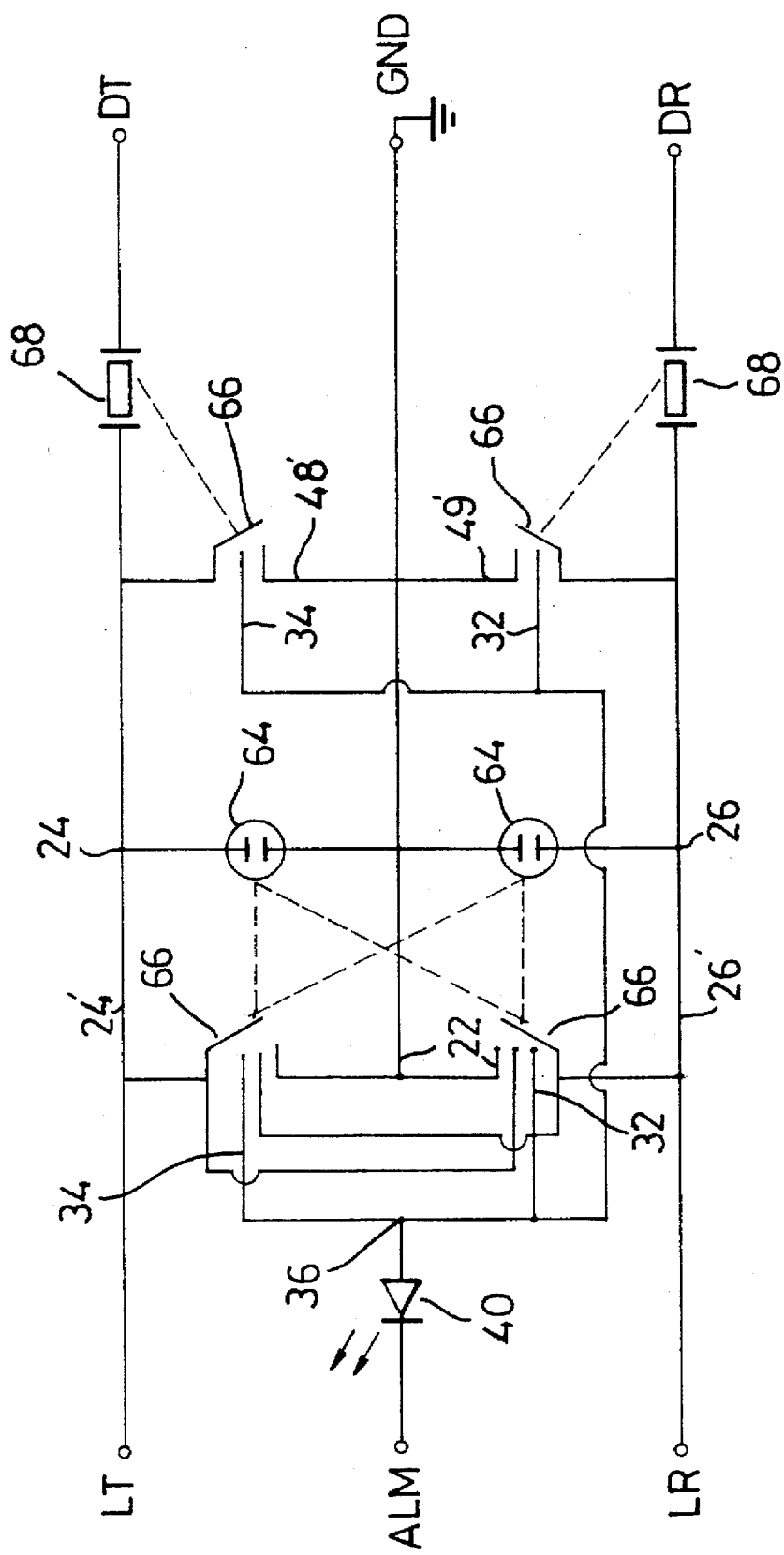
FIG. 4 is a circuit diagram of the protector module of the present invention.

When the springs 62, the arresters 64, the tin bits 66, and the thermistors 68 are sandwiched by the blocks 60' and 60", the extension arms 63 of the springs 62 on the first surface of the PCB 20 are soldered into the through holes 48, 49, the extension arms 63 of the springs 62 on the second surface of the PCB 20 are soldered into the through holes 44, 46, and the LED 40 is connected to the through holes 36, 42 as shown in FIG. 3, an equivalent circuit of the protector module is achieved as shown in FIG. 4.

Referring to FIGS. 2 and 4, when an abnormal voltage signal with a high current is received by the input terminal means, i.e., input prongs LT, LR, the high current will flow in the thermistors 68 via the lines 24', 26'. This causes the thermistors 68 to have a high impedance and generate a high temperature therein. When such a high temperature reaches a predetermined temperature, the tin bits 66 will be melted. This will enable the thermistors 68 to contact the through hole 32, 34 connecting to the LED 22 (shown in FIG. 1), the lines 48' and 49' connecting to ground potential, and the lines 26', 24' connecting to the input prongs LR, LT, simultaneously. Thus, the prongs LR, LT are grounded and the LED 40 glows. Thus, the illuminated LED 40 shows the thermistors 68 are damaged and the input terminal means is grounded.

Referring to FIGS. 1 and 4, as the inlet prongs LR, LT are struck by lightning, high-voltage pulses will pass through the lines 24', 26' and the through holes 24, 26 then reach the arrester 64. Thus, the tin bit 66 sandwiched between the arrester 64 and the first surface of the PCB 20 (in FIG. 3) melts due to the heat generated by discharge effect so that the arrester 64 will move toward the through holes 32, 34 and electrically connect to the through hole 36 to illuminate the LED 40. Meanwhile, the arresters 64 will simultaneously connect to the grounded pad portion 22. Thus, both of the inlet prongs LR, LT are grounded thereby the grounding of the protector module is improved.

Referring to FIG. 3, the blocks 60' and 60" are marginally received by the housing 10 such that the PCB 20 is secured in place and the springs 62, the arresters 64, the tin bits 66, and the thermistors 68 are tightly secured within the protector module.

Although the invention has been explained in relation to its preferred embodiment, it is to be understood that many other possible modifications and variations can be made without departing from the spirit and scope of the invention as hereinafter claimed.

I claim:

1. A protector module, comprising:

a housing having an end wall and an opening opposite to said end wall;

an insulating member forming a base, said member closing said opening;

two input prongs projecting from the base for receiving electrical signals from an outside plant;

two output prongs projecting from the base for outputting electrical signals to exchange equipment;

a ground prong projecting from the base for grounding an abnormal signal induced by lightning strikes;

an indicating device having a first end connected to a negative voltage source for indicating the failure of the protector module and a second end;

a printed circuit board having a first surface defining a ground pad portion electrically connected to the ground prong, a first through hole and a second through hole near the ground pad portion and electrically connected to the input prongs, respectively, a third through hole and a fourth through hole near the first and the second through holes and electrically connected to the second end of the indicating device and a second surface defining a fifth through hole and a sixth through hole electrically connected to the ground pad portion and each having a line extending toward the first and the second through holes, respectively;

a first block and a second block respectively mounted on the first surface and the second surface of the printed circuit board and each of the blocks defining two recesses;

first and second springs each having an extension arm, first and second arresters, and first and second tin bits each having a pin respectively received within each of the recesses of the first block with the extension arms electrically connected to the ground pad portion, the pins extending to the first and the second through holes, and the arresters facing the ground pad portion and the third and the fourth through holes respectively; and biasing means having extension legs, first and second thermistors, and fusible means having protrusions respectively received with each of the recesses of the second block with the extension legs electrically connected to the output prongs, the protrusions extending into the first and the second through holes, and the thermistors facing the lines extending toward the first and the second through holes and the third and the fourth through holes.

2. A protector module as claimed in claim 1, wherein said first and second through holes each further defines a line extending toward each other such that when either one of the arresters is struck by lightning, another arrester will be grounded simultaneously.

3. A protector module as claimed in claim 1, wherein said blocks are marginally received within the opening such that the printed circuit board is secured in place and the springs, the arresters, the tin bits, the biasing means, the fusible means, and the thermistors are tightly secured within the protector module.

4. A protector module as claimed in claim 1, wherein said printed circuit board defines a plurality of passages and said blocks each having a corresponding number of apertures and bosses such that the bosses may extend through the passages in the printed circuit board and engage with the apertures as to mount the blocks together.

* * * * *